(12) United States Patent
Hsiao

(10) Patent No.: US 9,564,390 B2
(45) Date of Patent: Feb. 7, 2017

(54) PACKAGE STRUCTURE AND FABRICATION METHOD THEREOF

(71) Applicant: Siliconware Precision Industries Co., Ltd., Taichung (TW)

(72) Inventor: Wei-Chung Hsiao, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 14/695,125

(22) Filed: Apr. 24, 2015

(65) Prior Publication Data

US 2016/0133551 A1 May 12, 2016

(30) Foreign Application Priority Data

Nov. 12, 2014 (TW) ............... 103139186 A

(51) Int. Cl.
| | |
|---|---|
| H01L 21/48 | (2006.01) |
| H01L 21/56 | (2006.01) |
| H01L 23/00 | (2006.01) |
| H01L 23/31 | (2006.01) |
| H01L 23/495 | (2006.01) |
| H01L 23/498 | (2006.01) |

(52) U.S. Cl.
CPC ..... *H01L 23/49811* (2013.01); *H01L 21/4853* (2013.01); *H01L 21/4857* (2013.01); *H01L 21/563* (2013.01); *H01L 23/3157* (2013.01); *H01L 23/49816* (2013.01); *H01L 23/49861* (2013.01); *H01L 24/81* (2013.01); *H01L 23/49827* (2013.01); *H01L 2924/37001* (2013.01); *H01L 2924/384* (2013.01)

(58) Field of Classification Search
CPC ............ H01L 2224/73204; H01L 2224/16227; H01L 23/481; H01L 23/3142; H01L 24/81; H01L 2924/00; H01L 23/49827; H01L 23/562; H01L 2224/32225; H01L 24/16; H01L 23/49816
See application file for complete search history.

(56) References Cited

U.S. PATENT DOCUMENTS 8,421,245 B2 * 4/2013 Gonzalez ............. H01L 21/568
257/738

* cited by examiner

*Primary Examiner* — Jasmine Clark
(74) *Attorney, Agent, or Firm* — Mintz Levin Cohn Ferris Glovsky and Popeo, P.C.; Peter F. Corless; Steven M. Jensen

(57) ABSTRACT

A package structure is provided, which includes: a dielectric layer having opposite first and second surfaces; a first circuit layer embedded in the dielectric layer and having a surface exposed from the first surface of the dielectric layer; a plurality of conductive posts embedded in the dielectric layer and electrically connected to the first circuit layer and having one ends exposed from the second surface of the dielectric layer; a second circuit layer formed on the second surface of the dielectric layer and electrically connected the ends of the conductive posts exposed from the second surface of the dielectric layer; and a plurality of protruding elements formed on the surface of the first circuit layer exposed from the first surface of the dielectric layer, thereby providing a large contact area so as to strengthen bonding between a semiconductor chip and the first circuit layer of the package structure.

15 Claims, 7 Drawing Sheets

PACKAGE STRUCTURE AND FABRICATION METHOD THEREOF

CROSS-REFERENCES TO RELATED APPLICATIONS

This application claims under 35 U.S.C. §119(a) the benefit of Taiwanese Application No. 103139186, filed Nov. 12, 2014, the entire contents of which are incorporated herein by reference.

BACKGROUND OF THE INVENTION

1. Field of the Invention

The present invention relates to package structures and fabrication methods thereof, and more particularly, to a package structure having protruding elements formed on a circuit layer thereof and a method for fabricating the package structure.

2. Description of Related Art

Along with the rapid development of electronic industries, electronic products are developed toward the trend of multi-function and high performance. To meet the high integration and miniaturization requirements of package structures, conductive pads of circuit layers of the package structures are continuously reduced in size.

Generally, a semiconductor chip is disposed on the conductive pads of a circuit layer through a plurality of conductive bumps. However, during a reflow process, the conductive bumps easily collapse and overflow, which adversely affects the electrical connection quality and even causes a short circuit to occur between adjacent conductive bumps. Further, the contact area between the conductive pads and the conductive bumps is quite small due to planar contact surfaces of the conductive pads, thus leading to a poor bonding between the conductive pads and the conductive bumps and consequently reducing the product reliability.

FIGS. 1A to 1D are schematic cross-sectional views showing a package structure 1 and a fabrication method thereof according to the prior art.

Referring to FIG. 1A, a carrier 10 is provided, and a circuit layer 11 having a plurality of conductive pads 111 is formed on the carrier 10.

Referring to FIG. 1B, a first encapsulant 12 is formed on the carrier 10 to encapsulate the circuit layer 11. The first encapsulant 12 has a first surface 12a and a second surface 12b opposite to the first surface 12a and facing the carrier 10.

Referring to FIG. 1C, the overall structure of FIG. 1B is turned upside down and the carrier 10 is removed. Then, a chip 13 is disposed on the conductive pads 111 of the circuit layer 11 through a plurality of conductive bumps 14.

Referring to FIG. 1D, a second encapsulant 15 is formed on the second surface 12b of the first encapsulant 12 to encapsulate the circuit layer 11, the chip 13 and the conductive bumps 14. Further, a plurality of openings 121 are formed on the first surface 12a of the first encapsulant 12 to expose portions of the circuit layer 11, and a plurality of solder balls 16 are formed in the openings 121 and electrically connected to the circuit layer 11. As such, a package structure 1 is obtained.

However, the package structure 1 has several drawbacks. During a reflow process, the conductive bumps 14 easily collapse and the conductive material (for example, solder material) of the conductive bumps 14 easily overflows, thus adversely affecting the electrical connection quality and even causing a short circuit to occur between adjacent conductive bumps 14. Further, planar contact surfaces 112 of the conductive pads 111 result in a small contact area between the conductive pads 111 and the conductive bumps 14, thus leading to a poor bonding between the conductive bumps 14 and the circuit layer 11 and consequently reducing the product reliability.

Therefore, there is a need to provide a package structure and a fabrication method thereof so as to overcome the above-described drawbacks.

SUMMARY OF THE INVENTION

In view of the above-described drawbacks, the present invention provides a package structure, which comprises: a dielectric layer having opposite first and second surfaces; a first circuit layer embedded in the dielectric layer and having a surface exposed from the first surface of the dielectric layer; a plurality of conductive posts embedded in the dielectric layer and electrically connected to the first circuit layer and having one ends exposed from the second surface of the dielectric layer; a second circuit layer formed on the second surface of the dielectric layer and electrically connected to the ends of the conductive posts exposed from the second surface of the dielectric layer; and a plurality of protruding elements formed on the surface of the first circuit layer exposed from the first surface of the dielectric layer.

In an embodiment, the dielectric layer is made of an encapsulant or a prepreg.

In an embodiment, the first circuit layer has a plurality of first conductive pads, and the protruding elements are formed on the first conductive pads.

In an embodiment, the protruding elements and the first conductive pads are made of a same material and separately or integrally formed.

In an embodiment, the protruding elements are less than or equal in width to the first conductive pads.

In an embodiment, the protruding elements are conductive posts or bonding pads of conductive traces.

In an embodiment, the second circuit layer has a plurality of second conductive pads, and the ends of the conductive posts exposed from the second surface of the dielectric layer are electrically connected to the second conductive pads and opposite ends of the conductive posts are electrically connected to the first circuit layer.

In an embodiment, the package structure further comprises an insulating layer formed on the second surface of the dielectric layer to encapsulate the second circuit layer and expose portions of the second circuit layer.

The present invention further provides a method for fabricating a package structure, which comprises the steps of: providing a dielectric layer having opposite first and second surfaces, wherein a first circuit layer is embedded in the dielectric layer and has a surface exposed from the first surface of the dielectric layer, a plurality of conductive posts are embedded in the dielectric layer and electrically connected to the first circuit layer and have one ends exposed from the second surface of the dielectric layer, and a plurality of protruding elements are formed on the surface of the first circuit layer exposed from the first surface of the dielectric layer; and forming a second circuit layer on the second surface of the dielectric layer, wherein the second circuit layer is electrically connected to the ends of the conductive posts exposed from the second surface of the dielectric layer.

In an embodiment, providing the dielectric layer comprises: preparing a carrier having opposite first and second surfaces; forming a plurality of recessed portions on the second surface of the carrier; forming the protruding elements in the recessed portions; forming the first circuit layer on the second surface of the carrier; forming the conductive posts on the first circuit layer; and forming the dielectric layer.

In an embodiment, the protruding elements have lower surfaces flush with the second surface of the carrier.

In an embodiment, forming the first circuit layer comprises: forming a first resist layer on the second surface of the carrier and lower surfaces of the protruding elements; forming a plurality of first openings in the first resist layer; and forming the first circuit layer in the first openings of the first resist layer, wherein the first circuit layer has a plurality of first conductive pads electrically connected to the lower surfaces of the protruding elements.

In an embodiment, forming the conductive posts comprises: forming a second resist layer on the first resist layer and the first circuit layer, wherein the second resist layer has a plurality of second openings exposing portions of the first circuit layer; and forming the conductive posts in the second openings of the second resist layer, wherein the conductive posts are electrically connected to the exposed portions of the first circuit layer through first ends thereof.

In an embodiment, forming the dielectric layer comprises: removing the first resist layer and the second resist layer to expose the first circuit layer and the conductive posts; and forming the dielectric layer on the carrier so as to encapsulate the first circuit layer and the conductive posts and expose second ends of the conductive posts.

In an embodiment, forming the second circuit layer comprises: forming a third resist layer on the second surface of the dielectric layer, wherein the third resist layer has a plurality of third openings exposing the second ends of the conductive posts and portions of the second surface of the dielectric layer; and forming the second circuit layer in the third openings, wherein the second circuit layer has a plurality of second conductive pads electrically connected to the second ends of the conductive posts.

In an embodiment, the method further comprises: removing the third resist layer to expose the second surface of the dielectric layer and the second circuit layer; and forming an insulating layer on the second surface of the dielectric layer to encapsulate the second circuit layer and expose portions of the second circuit layer.

In an embodiment, the method further comprises: forming on the first surface of the carrier a frame having at least an opening; removing a portion of the carrier corresponding to the opening of the frame; and performing a singulation process.

In an embodiment, the method further comprises forming a first surface finish layer on the first circuit layer and contact surfaces of the protruding elements or forming a second surface finish layer on the second circuit layer.

In an embodiment, the method further comprises disposing a semiconductor component on the protruding elements through a plurality of first conductive elements, wherein the first conductive elements encapsulate contact surfaces of the protruding elements.

In the above-described structure and method, a semiconductor component can be disposed on the protruding elements through a plurality of first conductive elements, the first conductive elements encapsulating contact surfaces of the protruding elements. The first conductive elements can be bumps.

In the above-described structure and method, an insulating material can be formed between the first surface of the dielectric layer and the semiconductor component to encapsulate the first circuit layer and the first conductive elements. The insulating material can be an underfill or an encapsulant.

In the above-described structure and method, a plurality of second conductive elements can be formed on the second surface finish layer and electrically connected to the second circuit layer.

According to the present invention, a plurality of protruding elements are formed on the first conductive pads of the first circuit layer, and a semiconductor component such as a chip is disposed on the protruding elements through a plurality of first conductive elements, with the first conductive elements encapsulating three-dimensional contact surfaces (including, for example, upper and side surfaces) of the protruding elements.

Therefore, since the protruding elements do not collapse during a reflow process, the present invention prevents overflow of the conductive material (for example, solder material) of the first conductive elements that would otherwise adversely affect the electrical connection quality and even cause a short circuit between adjacent first conductive elements. Further, the present invention strengthens the bonding between the first conductive elements and the first conductive pads of the first circuit layer through the large contact area of the protruding elements, thus improving the product reliability.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "first", "second", "contact surface", "end", "on", "a" etc. are merely for illustrative purposes and should not be construed to limit the scope of the present invention.

Figure 1A:
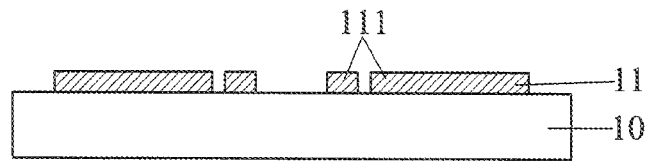
FIGS. 1A to 1D are schematic cross-sectional views showing a package structure and a fabrication method thereof according to the prior art.
Figure 1B:
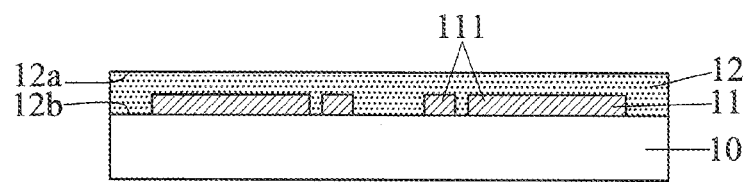
Figure 1C:
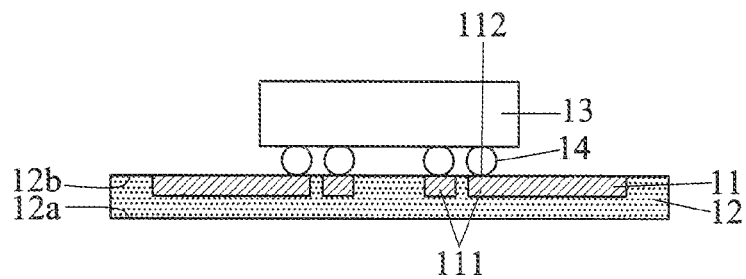
Figure 1D:
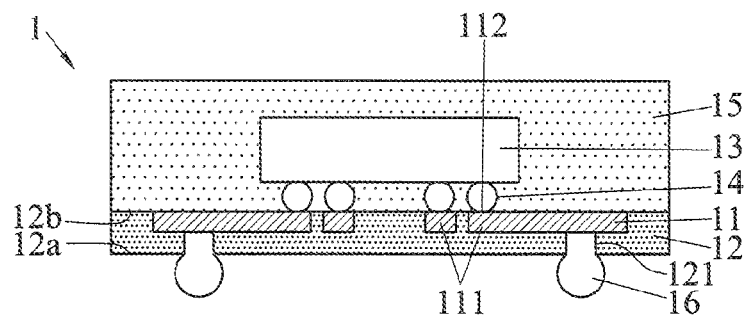
Figure 2A:
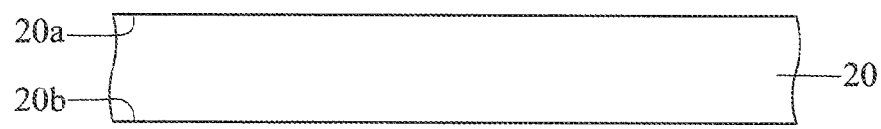
FIGS. 2A to 2Q are schematic cross-sectional views showing a package structure and a fabrication method thereof according to the present invention, wherein FIG. 2L' shows another embodiment of FIG. 2L.
Figure 2B:
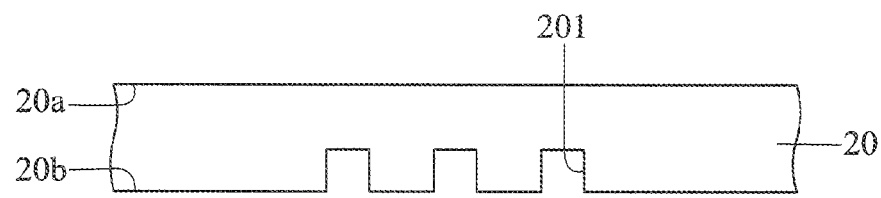
Figure 2C:
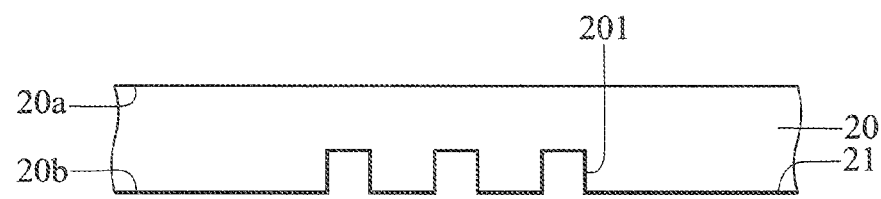
Figure 2D:
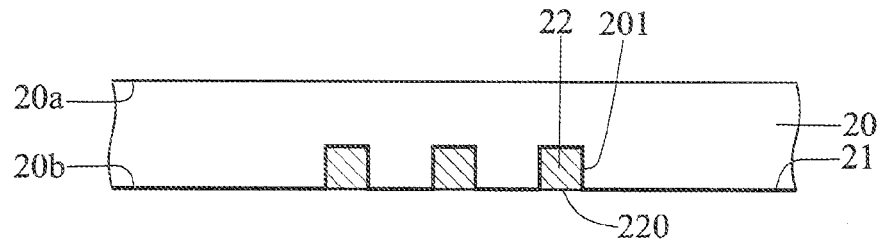
Figure 2E:
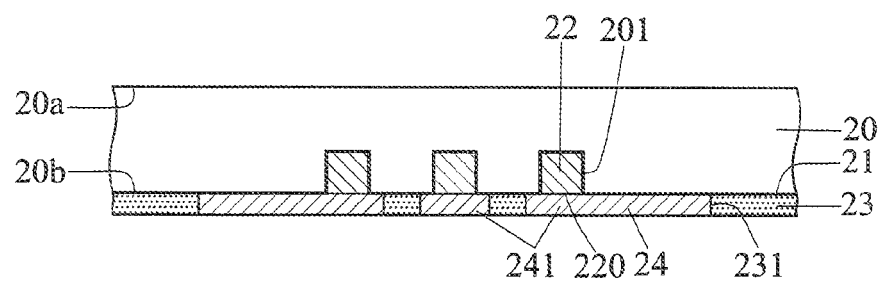
Figure 2F:
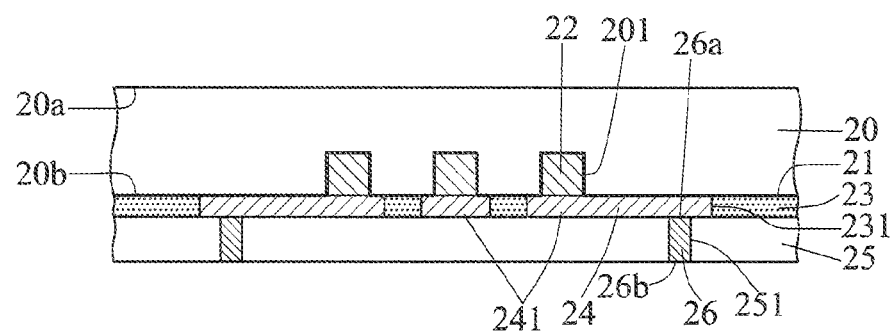
Figure 2G:
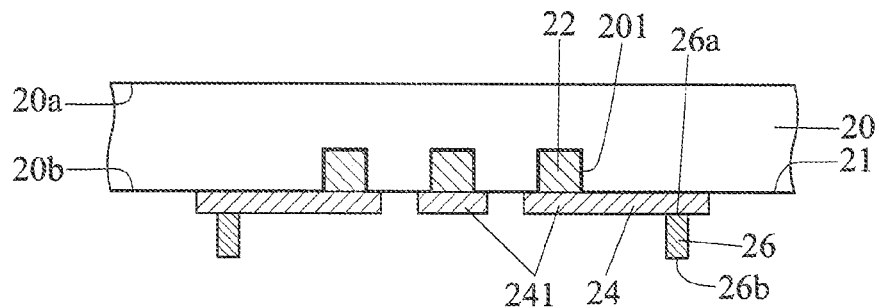
Figure 2H:
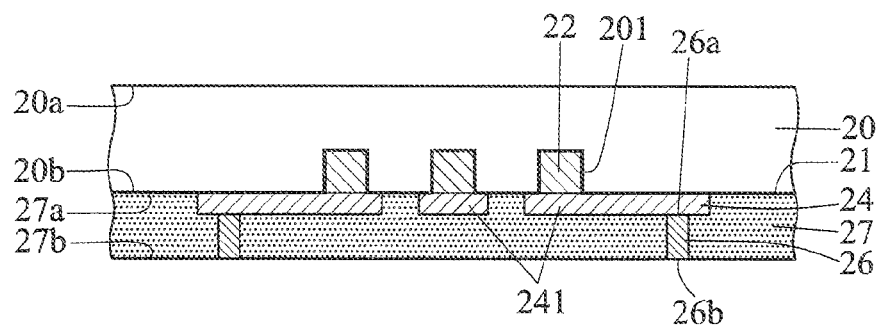
Figure 2I:
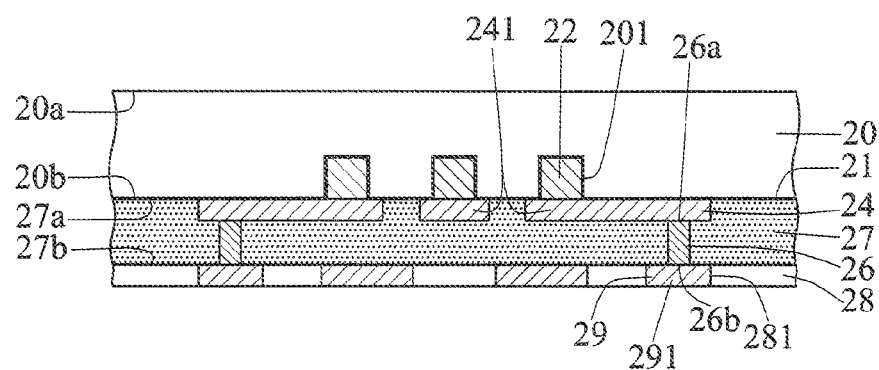
Figure 2J:
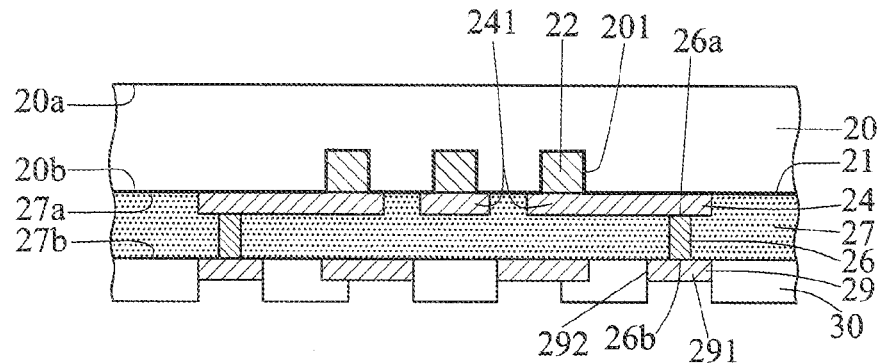
Figure 2K:
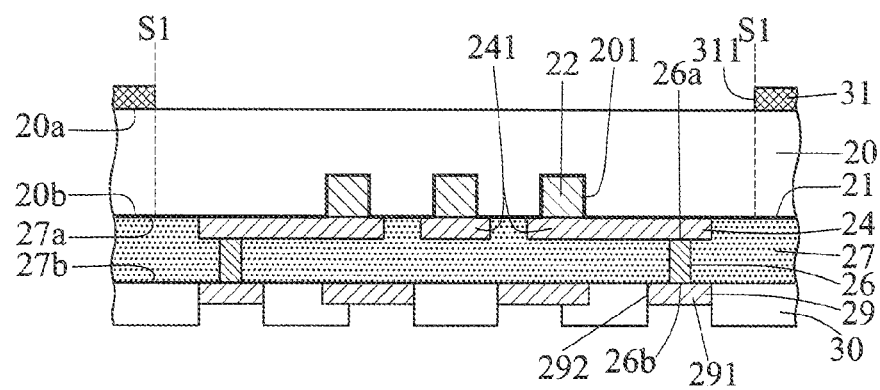
Figure 2L:
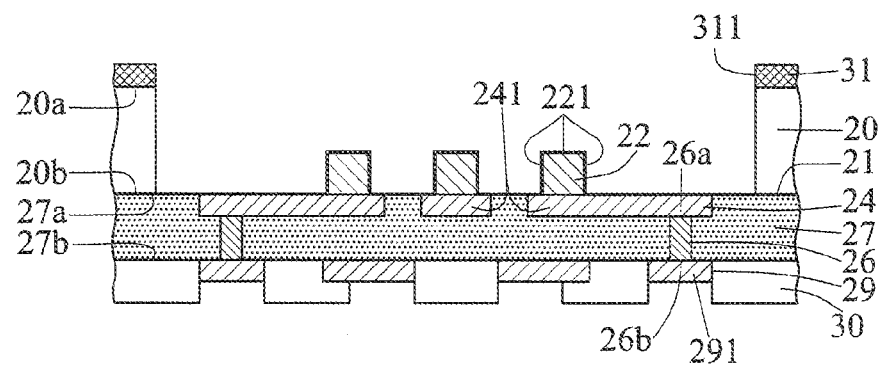
Figure 2L:
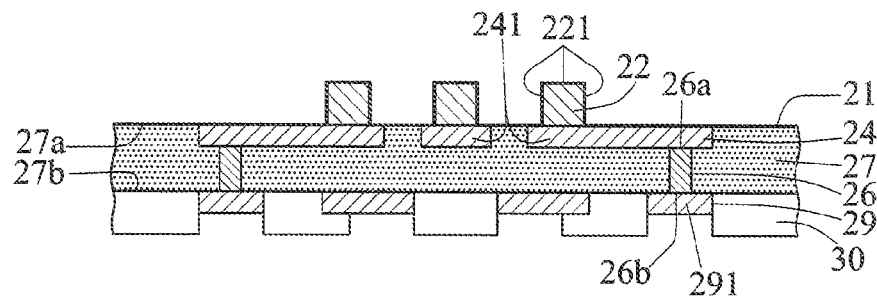
Figure 2M:
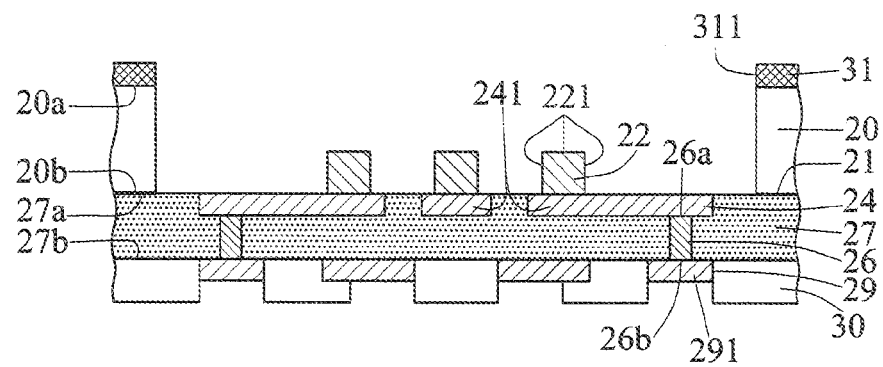
Figure 2N:
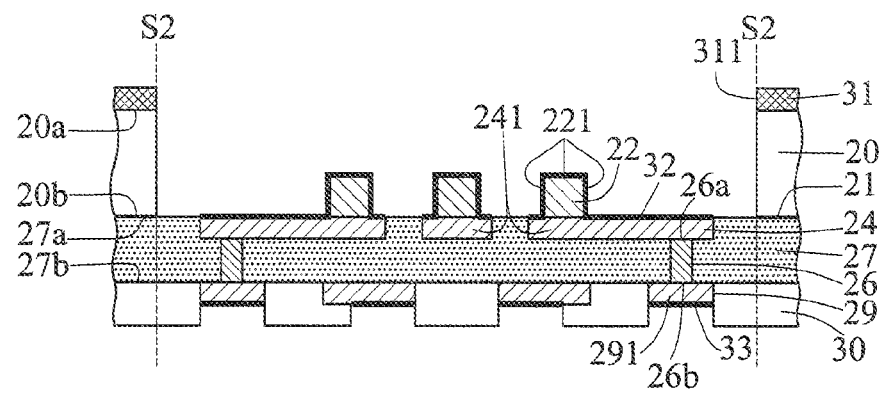
Figure 2O:
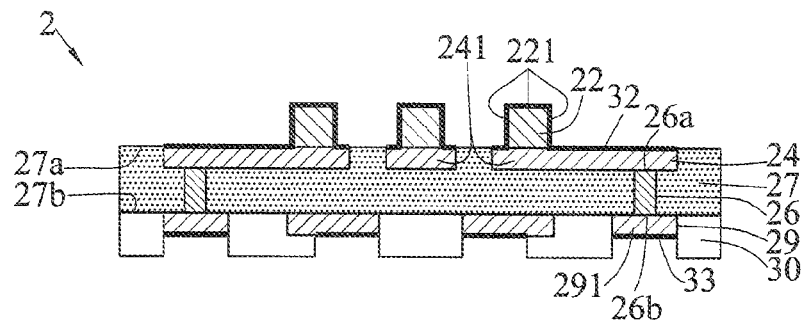
Figure 2P:
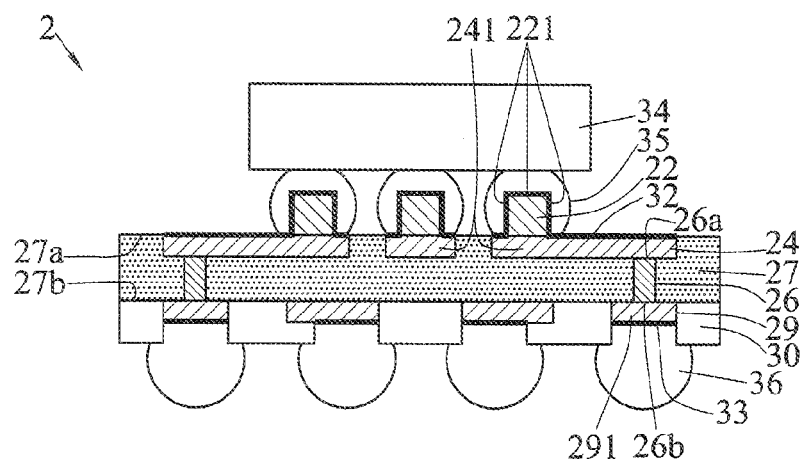
Figure 2Q:
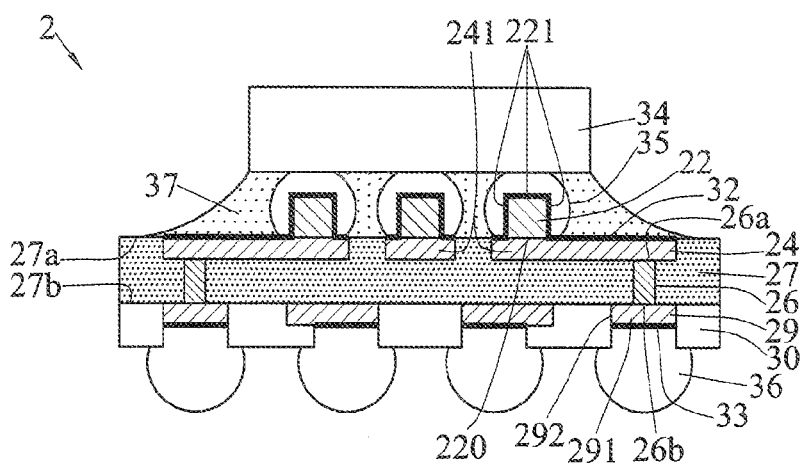

FIGS. 2A to 2Q are schematic cross-sectional views showing a package structure 2 and a fabrication method thereof according to the present invention. Therein, FIG. 2L' shows another embodiment of FIG. 2L.

Referring to FIG. 2A, a carrier 20 having opposite first and second surfaces 20a, 20b is provided. The carrier 20 can be a substrate, an interposer, a metal board or a stainless steel board.

Referring to FIG. 2B, a plurality of recessed portions 201 are formed on the second surface 20b of the carrier 20 by etching or laser drilling.

Referring to FIG. 2C, a seed layer 21 is formed by such as sputtering on the second surface 20b of the carrier 20 and surfaces such as inner wall surfaces and bottom surfaces of the recessed portions 201. The seed layer 21 can be a conductive layer.

Referring to FIG. 2D, a plurality of protruding elements 22 are formed on the seed layer 21 in the recessed portions 201. The lower surfaces 220 of the protruding elements 22 are flush with the seed layer 21 or the second surface 20b of the carrier 20. The protruding elements 22 are conductive posts, such as copper posts, or bonding pads of conductive traces.

Referring to FIG. 2E, a first resist layer 23 is formed on the seed layer 21 and the lower surfaces 220 of the protruding elements 22, and a plurality of first openings 231 are formed in the first resist layer 23.

Then, a first circuit layer 24 is formed in the first openings 231 of the first resist layer 23. The first circuit layer 24 has a plurality of first conductive pads 241 electrically connected to the lower surfaces 220 of the protruding elements 22. As such, the protruding elements 22 are located on the first circuit layer 24.

In the present embodiment, the protruding elements 22 and the first circuit layer 24 are separately formed. The protruding elements 22 and the first circuit layer 24 can be made of same or different materials. In other embodiments, the protruding elements 22 and the first circuit layer 24 can be integrally formed and made of a same material.

Referring to FIG. 2F, a second resist layer 25 is formed on the first resist layer 23 and the first circuit layer 24 and has a plurality of second openings 251 exposing portions of the first circuit layer 24.

Then, a plurality of conductive posts 26 are formed in the second openings 251 of the second resist layer 25. The conductive posts 26 have first ends 26a electrically connected to the exposed portions of the first circuit layer 24 and second ends 26b opposite to the first ends 26a and exposed from the second resist layer 25. The conductive posts 26 can be metal posts, for example, copper posts. The conductive posts 26 can be formed by embedding or filling a metal or conductive material in the second openings 251 of the second resist layer 25.

Referring to FIG. 2G, the first resist layer 23 and the second resist layer 25 are removed to expose the seed layer 21, the first circuit layer 24 and the conductive posts 26.

Referring to FIG. 2H, a dielectric layer 27 is formed on the second surface 20b of the carrier 20 to encapsulate the first circuit layer 24 and the conductive posts 26 and expose the second ends 26b of the conductive posts 26. The dielectric layer 27 has a first surface 27a facing the second surface 20b of the carrier 20 and a second surface 27b opposite to the first surface 27a. As such, the first circuit layer 24 and the conductive posts 26 are embedded in the dielectric layer 27, with a surface of the first circuit layer 24 being exposed from the first surface 27a of the dielectric layer 27 and the second ends 26b of the conductive posts 26 being exposed from the second surface 27b of the dielectric layer 27. The dielectric layer 27 can be made of an encapsulant or a prepreg.

Referring to FIG. 2I, a third resist layer 28 is formed on the second surface 27b of the dielectric layer 27 and has a plurality of third openings 281 exposing the second ends 26b of the conductive posts 26 and portions of the second surface 27b of the dielectric layer 27.

Then, a second circuit layer 29 is formed in the third openings 281 of the third resist layer 28 and has a plurality of second conductive pads 291 electrically connected to the second ends 26b of the conductive posts 26.

Referring to FIG. 2J, the third resist layer 28 is removed to expose the second surface 27b of the dielectric layer 27 and side surfaces 292 of the second circuit layer 29.

Then, an insulating layer 30, for example, a solder mask, is formed on the second surface 27b of the dielectric layer 27 to encapsulate the second circuit layer 29 and expose portions of the second circuit layer 29.

In the present embodiment, the insulating layer 30 is formed to be higher than the second circuit layer 29. In other embodiments, the insulating layer 30 can be formed to be flush with the second circuit layer 29.

Referring to FIG. 2K, a frame 31 having at least an opening 311 is disposed on the first surface 20a of the carrier 20 corresponding to an outer periphery of the first circuit layer 24. The frame 31 can have one opening or a plurality of openings arranged in an array. The frame 31 can be made of a metal material or an anti-etching material.

Referring to FIG. 2L, a portion of the carrier 20 is removed along a line S1 of FIG. 2k corresponding to the opening 311 of the frame 31, thereby exposing the seed layer 21.

In other embodiments, the seed layer 21 can be dispensed with. As such, the first surface 27a of the dielectric layer 27, the first circuit layer 24, and contact surfaces 221 (including, for example, upper and side surfaces) of the protruding elements 22 are exposed.

In another embodiment, referring to FIG. 2L', the frame 31 is dispensed with, and the carrier 20 is completely removed to expose the seed layer 21.

Referring to FIG. 2M, continued from FIG. 2L, the seed layer 21 in the opening 311 of the frame 31 is removed to expose the first surface 27a of the dielectric layer 27, the first circuit layer 24 and the contact surfaces 221 of the protruding elements 22.

Referring to FIG. 2N, a first surface finish layer 32, for example, an anti-oxidation layer, is formed on the first circuit layer 24 and the contact surfaces 221 of the protruding elements 22. Further, a second surface finish layer 33, for example, an anti-oxidation layer, can be formed on the second circuit layer 29.

Referring to FIG. 2O, a singulation process is performed along a cutting line S2 of FIG. 2N corresponding to the opening 311 of the frame 31 so as to form a plurality of package structures 2.

Referring to FIG. 2P, a semiconductor component 34 such as a chip is disposed on the protruding elements 22 through a plurality of first conductive elements 35 such as bumps. The first conductive elements 35 encapsulate the first surface finish layer 32 on the contact surfaces 221 (for example, upper and side surfaces) of the protruding elements 22 and even encapsulate the first surface finish layer 32 on the first conductive pads 241. Further, a plurality of second conductive elements 36 such as solder balls can be formed on the second surface finish layer 33 and electrically connected to the second conductive pads 291 of the second circuit layer 29.

In other embodiments, the semiconductor components 34 can be disposed on the protruding elements 22 before the singulation process is performed. Further, the first surface finish layer 32 and the second surface finish layer 33 can be dispensed with. As such, the first conductive elements 35 encapsulate the contact surfaces 221 of the protruding elements 22 and even the first conductive pads 241. The second conductive elements 36 are formed on the second conductive pads 291.

Referring to FIG. 2Q, an insulating material 37 is formed between the first surface 27a of the dielectric layer 27 and the semiconductor component 34 to encapsulate the first surface finish layer 32 and the first conductive elements 35. In other embodiments, if the first surface finish layer 32 is not formed, the insulating material 37 directly encapsulates the first circuit layer 24. The insulating material 37 is an underfill or an encapsulant.

The present invention further provides a package structure 2, which has: a dielectric layer 27 having opposite first and second surfaces 27a, 27b; a first circuit layer 24 embedded in the dielectric layer 27 and having a surface exposed from the first surface 27a of the dielectric layer 27; a plurality of conductive posts 26 embedded in the dielectric layer 27 and having first ends 26a electrically connected to the first circuit layer 24 and second ends 26b opposite to the first ends 26a and exposed from the second surface 27b of the dielectric layer 27; a second circuit layer 29 formed on the second surface 27b of the dielectric layer 27 and electrically connected to the second ends 26b of the conductive posts 26 exposed from the second surface 27b of the dielectric layer 27; and a plurality of protruding elements 22 formed on the surface of the first circuit layer 24 exposed from the first surface 27a of the dielectric layer 27.

The dielectric layer 27 can be made of an encapsulant or a prepreg.

The first circuit layer 24 can have a plurality of first conductive pads 241.

The conductive posts 26 can be metal posts, for example, copper posts.

The second circuit layer 29 can have a plurality of second conductive pads 291, and the second ends 26b of the conductive posts 26 can be electrically connected to the second conductive pads 291.

The protruding elements 22 can be formed on the first conductive pads 241 of the first circuit layer 24. The protruding elements 22 have contact surfaces 221 including, for example, upper and side surfaces. The width of the protruding elements 22 can be less than or equal to the width of the first conductive pads 241. The protruding elements 22 and the first conductive pads 241 can be made of same or different materials, and can be separately or integrally formed. The protruding elements 22 can be conductive posts, for example, copper posts, or bonding pads of conductive traces.

The package structure 2 can further have a semiconductor component 34 such as a chip disposed on the protruding elements 22 through a plurality of first conductive elements 35, and the first conductive elements 35 encapsulates the contact surfaces 221 of the protruding elements 22. The first conductive elements 35 can be bumps.

The package structure 2 can further have a first surface finish layer 32, for example, an anti-oxidation layer, formed on the first circuit layer 24 and the contact surfaces 221 of the protruding elements 22. As such, the first conductive elements 35 encapsulate the first surface finish layer 32 on the contact surfaces 221 (for example, upper and side surfaces) of the protruding elements 22 and even encapsulate the first surface finish layer 32 on the first conductive pads 241.

In other embodiments, the first surface finish layer 32 can be dispensed with. As such, the first conductive elements 35 directly encapsulate the contact surfaces 221 of the protruding elements 22 and even the first conductive pads 241.

The package structure 2 can further have a second surface finish layer 33, for example, an anti-oxidation layer, formed on the second circuit layer 29.

The package structure 2 can further have an insulating layer 30 formed on the second surface 27b of the dielectric layer 27 to encapsulate the second circuit layer 29.

The package structure 2 can further have a plurality of second conductive elements 36 formed on the second surface finish layer 33 and electrically connected to the second conductive pads 291 of the second circuit layer 29. In other embodiments, the second surface finish layer 33 can be dispensed with. As such, the second conductive elements 36 are directly formed on the second conductive pads 291 of the second circuit layer 29.

The package structure 2 can further have an insulating material 37 formed between the first surface 27a of the dielectric layer 27 and the semiconductor component 34 to encapsulate the first surface finish layer 32 on the first circuit layer 24 and the first conductive elements 35. The insulating material 37 can be an underfill or an encapsulant.

According to the present invention, a plurality of protruding elements are formed on the first conductive pads of the first circuit layer, and a semiconductor component is disposed on the protruding elements through a plurality of first conductive elements, with the first conductive elements encapsulating three-dimensional contact surfaces (including, for example, upper and side surfaces) of the protruding elements.

Therefore, since the protruding elements do not collapse during a reflow process, the present invention prevents overflow of the conductive material (for example, solder material) of the first conductive elements that would otherwise adversely affect the electrical connection quality and even cause a short circuit between adjacent first conductive elements. Further, the present invention strengthens the bonding between the first conductive elements and the first conductive pads of the first circuit layer through the large contact area of the protruding elements, thus improving the product reliability.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A package structure, comprising:
   a dielectric layer having opposite first and second surfaces;
   a first circuit layer embedded in the dielectric layer and having a surface exposed from the first surface of the dielectric layer;
   a plurality of conductive posts embedded in the dielectric layer and electrically connected to the first circuit layer and each having one end exposed from the second surface of the dielectric layer;
   a second circuit layer formed on the second surface of the dielectric layer and electrically connected to the ends of the conductive posts exposed from the second surface of the dielectric layer; and
   a plurality of protruding elements formed on the surface of the first circuit layer exposed from the first surface of the dielectric layer, wherein the protruding elements are free from being encapsulated by dielectric material.

2. The structure of claim 1, wherein the dielectric layer is made of an encapsulant or a prepreg.

3. The structure of claim 1, wherein the first circuit layer has a plurality of first conductive pads, and the protruding elements are formed on the first conductive pads.

4. The structure of claim 3, wherein the protruding elements and the first conductive pads are made of a same material and separately or integrally formed.

5. The structure of claim 3, wherein the protruding elements are less than or equal in width to the first conductive pads.

6. The structure of claim 1, wherein the protruding elements are conductive posts or bonding pads of conductive traces.

7. The structure of claim 1, wherein the second circuit layer has a plurality of second conductive pads, and the ends of the conductive posts exposed from the second surface of the dielectric layer are electrically connected to the second conductive pads and opposite ends of the conductive posts are electrically connected to the first circuit layer.

8. The structure of claim 1, further comprising an insulating layer formed on the second surface of the dielectric layer to encapsulate the second circuit layer and expose portions of the second circuit layer.

9. The structure of claim 1, further comprising a first surface finish layer formed on the first circuit layer and contact surfaces of the protruding elements.

10. The structure of claim 1, further comprising a semiconductor component disposed on the protruding elements through a plurality of first conductive elements, the first conductive elements encapsulating contact surfaces of the protruding elements.

11. The structure of claim 10, further comprising an insulating material formed between the first surface of the dielectric layer and the semiconductor component to encapsulate the first circuit layer and the first conductive elements.

12. The structure of claim 11, wherein the insulating material is an underfill or an encapsulant.

13. The structure of claim 10, wherein the first conductive elements are bumps.

14. The structure of claim 1, further comprising a second surface finish layer formed on the second circuit layer.

15. The structure of claim 14, further comprising a plurality of second conductive elements formed on the second surface finish layer and electrically connected to the second circuit layer.

* * * * *